United States Patent
Kobayashi et al.

(10) Patent No.: US 9,481,601 B2
(45) Date of Patent: Nov. 1, 2016

(54) BARRIER RIB PASTE, METHOD OF MANUFACTURING MEMBER INCLUDING BARRIER RIB, AND MEMBER INCLUDING BARRIER RIB

(71) Applicant: Toray Industries, Inc., Tokyo (JP)

(72) Inventors: Yasuhiro Kobayashi, Otsu (JP); Takahiro Tanino, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/402,230

(22) PCT Filed: May 15, 2013

(86) PCT No.: PCT/JP2013/063576
§ 371 (c)(1),
(2) Date: Nov. 19, 2014

(87) PCT Pub. No.: WO2013/176022
PCT Pub. Date: Nov. 28, 2013

(65) Prior Publication Data
US 2015/0284287 A1   Oct. 8, 2015

(30) Foreign Application Priority Data

May 25, 2012   (JP) .................................. 2012-119231

(51) Int. Cl.
| | | |
|---|---|---|
| *C03C 8/02* | (2006.01) | |
| *C03C 8/04* | (2006.01) | |
| *C03C 8/24* | (2006.01) | |
| *H01J 9/26* | (2006.01) | |
| *C03C 8/16* | (2006.01) | |
| *C03C 17/04* | (2006.01) | |
| *H01J 29/86* | (2006.01) | |
| *H01J 11/36* | (2012.01) | |
| *C03C 3/066* | (2006.01) | |
| *G03F 7/40* | (2006.01) | |
| *H01J 17/49* | (2012.01) | |
| *C03C 3/093* | (2006.01) | |
| *H01J 9/24* | (2006.01) | |

(52) U.S. Cl.
CPC ................. *C03C 8/16* (2013.01); *C03C 3/066* (2013.01); *C03C 3/093* (2013.01); *C03C 17/04* (2013.01); *G03F 7/40* (2013.01); *H01J 9/242* (2013.01); *H01J 9/265* (2013.01); *H01J 11/36* (2013.01); *H01J 17/49* (2013.01); *H01J 29/864* (2013.01); *C03C 2205/00* (2013.01); *H01J 2211/366* (2013.01)

(58) Field of Classification Search
CPC .......... H01J 9/241; H01J 17/49; H01J 11/36; C03C 8/02; C03C 8/04
See application file for complete search history.

(56) References Cited

U.S. PATENT DOCUMENTS

| | | | |
|---|---|---|---|
| 8,350,474 B2 * | 1/2013 | Ota ......................... | H01J 11/40 313/582 |
| 2012/0055692 A1 * | 3/2012 | Tanino ..................... | C03C 8/04 174/50 |

FOREIGN PATENT DOCUMENTS

| | | |
|---|---|---|
| JP | 11-52561 | 2/1999 |
| JP | 11092168 | * 4/1999 |
| JP | 2001-305729 | 11/2001 |
| JP | 2008-19145 | 1/2008 |
| JP | 2008-50594 | 3/2008 |
| JP | 2011-93790 | 5/2011 |
| JP | 2011-225439 | 11/2011 |
| JP | 2011-236114 | 11/2011 |
| JP | 2012-33454 | 2/2012 |
| WO | 2010/050590 | 5/2010 |
| WO | 2012/132652 | 10/2012 |

OTHER PUBLICATIONS

Machine translation of WO 2010050590, May 2010.*
Supplementary European Search Report dated Jan. 15, 2016 of corresponding European Application No. 13794452.6.

* cited by examiner

*Primary Examiner* — Karl Group
(74) *Attorney, Agent, or Firm* — DLA Piper LLP (US)

(57) ABSTRACT

A barrier rib paste includes a low-softening point glass powder which contains silicon oxide, aluminum oxide, an alkali metal oxide, and 24 to 37 mol % of boron oxide, and also contains an organic component, wherein the content of an alkali earth metal oxide is 4 mol % or less and the content of zinc oxide is 10 mol % or less.

5 Claims, No Drawings

BARRIER RIB PASTE, METHOD OF MANUFACTURING MEMBER INCLUDING BARRIER RIB, AND MEMBER INCLUDING BARRIER RIB

TECHNICAL FIELD

This disclosure relates to a barrier rib paste, a method of manufacturing a member including a barrier rib, and a member including a barrier rib.

BACKGROUND

Recently, the development of planar display panels such as a plasma display panel, a field emission display panel, a fluorescent display tube, a liquid crystal display device, an electroluminescence display panel, and a light emitting diode display panel has rapidly been made. Of these planar display panels, the plasma display panel is a display panel capable of displaying by allowing plasma discharge to occur between an anode electrode and a cathode electrode facing each other in a discharge space disposed between a front glass substrate and a rear glass substrate, and irradiating a phosphor provided in the discharge space with ultraviolet rays generated from a discharge gas sealed in the discharge space. The gas discharge type display panel such as a plasma display panel or a fluorescent display tube requires an insulating barrier rib to partition a discharge space. Also, the field emission type display panel requires an insulating barrier rib to separate a gate electrode from a cathode electrode.

Also in the medical field, a member including a barrier rib has attracted attention. Heretofore, an analogue type radiographic apparatus using a film has widely been used in medical practice. However, digital type radiographic apparatuses such as a computed radiography system and a planar X-ray detector have recently been developed. In the planar X-ray detector, a scintillator panel capable of changing radiations into visible rays by an X-ray phosphor is used. However, there is a problem such as low S/N ratio because of scattering of light emitted by the X-ray phosphor. Thus, there has been proposed a method in which an X-ray phosphor is partitioned by a barrier rib, thereby suppressing light scattering.

There have been known, as a method of forming these barrier ribs, a screen printing method in which a barrier rib paste is repeatedly applied to form a pattern by a screen printing plate, followed by drying and further firing, a sand blasting method in which masking is applied on a layer of a dried barrier rib material using a resist, followed by shaving through a sand blasting treatment and further firing, a mold transfer method (imprinting method) in which a mold with a pattern is pressed against a coating film of a barrier rib paste to form a barrier rib pattern, followed by firing, a photosensitive paste method (photolithographic method) in which a barrier rib material composed of a photosensitive paste material is applied, followed by drying, exposure, a developing treatment and further firing, and the like. All these barrier rib-forming methods are methods in which a barrier rib pattern is formed using a paste containing a low-softening point glass powder and an organic component, and then the organic component is removed by firing to form a barrier rib which is an insulating pattern containing the low-softening point glass. Of these methods, the photosensitive paste method is a method capable of realizing high definition and a large area, and is a method with high cost merit.

In a conventional barrier rib formation method, a barrier rib pattern is formed using a barrier rib paste containing a low-softening point glass powder and an organic component, followed by firing to form a barrier rib, thus leaving a carbon residue in the barrier rib after firing. When a large amount of this carbon is left, the barrier rib causes coloration, leading to a decrease in reflectance, thus causing a problem that an adverse influence is exerted on display characteristics such as luminance, and reliability.

Therefore, to produce a member including a barrier rib such as a high-reliability planar display panel or scintillator panel, the member being excellent in display characteristics such as luminance, there have been proposed various techniques capable of reducing a carbon residue after firing (Japanese Unexamined Patent Publication (Kokai) No. 2001-305729, Japanese Unexamined Patent Publication (Kokai) No. 2008-50594 and Japanese Unexamined Patent Publication (Kokai) No. 11-52561). Japanese Unexamined Patent Publication (Kokai) No. 2001-305729 uses, as an organic component in a barrier rib paste, a resin having a hydroxyl group and a polymerizable unsaturated group, for example, a polyol which is excellent in pyrolytic properties at high temperature. Japanese Unexamined Patent Publication (Kokai) No. 2008-50594 uses, as an organic component, an acrylic copolymer including a polyalkylene oxide segment having a high content of oxygen atoms to enhance pyrolytic properties of the organic component. Japanese Unexamined Patent Publication (Kokai) No. 11-52561 uses a low-softening point glass having a glass transition point, which is 10° C. or higher than the temperature at which the reduction ration of the organic component reaches 80%, so that a decomposition product of the organic component is not left in glass.

However, in these conventional techniques, it is impossible to reduce a carbon residue caused by poor pyrolytic properties which appear as a result of the reaction of an organic component with components in glass in a barrier rib paste or the barrier rib pattern formation step, leading to insufficient reduction of the carbon residue in a barrier rib. Thus, it could be helpful to provide a barrier rib paste excellent in pyrolytic properties of an organic component upon firing, and capable of forming a barrier rib which contains less carbon residue after firing and also has high reflectance. It could also be helpful to provide a member including a barrier rib such as a high-reliability planar display panel or scintillator panel, the member including a barrier rib which contains less carbon residue and also has high reflectance, and also being excellent in display characteristics such as luminance.

SUMMARY

We thus provide:

(1) A barrier rib paste including: a low-softening point glass powder which contains silicon oxide, aluminum oxide, an alkali metal oxide, and 24 to 37 mol % of boron oxide, and also contains an organic component, wherein the content of an alkali earth metal oxide is 4 mol % or less and the content of zinc oxide is 10 mol % or less.

(2) The barrier rib paste according to (1), wherein the content of boron oxide in the low-softening point glass powder is 24 to 34 mol %, and the content of sodium oxide in the low-softening point glass powder is 3.5 mol % or less.

(3) The barrier rib paste according to (1) or (2), which contains a photosensitive organic component as the organic component.

(4) A method for manufacturing a member including a barrier rib, which includes applying the barrier rib paste according to any one of (1) to (3) on a substrate, followed by firing to form a barrier rib.

(5) A method of manufacturing a member including a barrier rib, which includes applying the barrier rib paste according to (3) on a substrate, followed by exposure, development and further firing to form a barrier rib.

(6) A member including a barrier rib, including a low-softening point glass as a main component, wherein the low-softening point glass contains silicon oxide, aluminum oxide, an alkali metal oxide, and 24 to 37 mol % of a boron oxide, and the content of an alkali earth metal oxide is 4 mol % or less and the content of zinc oxide is 10 mol % or less.

(7) A plasma display panel including the member according to (6).

(8) A radiographic apparatus including the member according to (6).

It is thus possible to provide a barrier rib paste which is excellent in pyrolytic properties of an organic component upon firing, and also capable of forming a barrier rib which contains less carbon residue after firing and also has high reflectance. It is also possible to stably provide a member including a barrier rib, such as a high-reliability planar display panel or scintillator panel, the member including a barrier rib which contains less carbon residue and also has high reflectance, and also being excellent in display characteristics such as luminance.

DETAILED DESCRIPTION

A barrier rib paste means a mixture of an inorganic component and an organic component capable of forming a barrier rib by methods such as a screen printing method, a sand blasting method, an etching method, a mold transfer method (imprinting method), or a photosensitive paste method (photolithographic method).

The barrier rib paste is includes a low-softening point glass powder which contains silicon oxide, aluminum oxide, an alkali metal oxide, and 24 to 37 mol % of boron oxide, and also contains an organic component, wherein the content of an alkali earth metal oxide is 4 mol % or less and the content of zinc oxide is 10 mol % or less.

The low-softening point glass powder as the inorganic component means a powder of glass having a softening point of 570 to 620° C., namely, a low-softening point glass. The softening point within the above range leads to appropriate meltability in the firing step. Especially, in forming a barrier rib on a glass substrate, softening sufficiently occurs even if sintering is performed at comparatively low temperature so as not to cause a problem such as distortion of the glass substrate, thus making it possible to obtain a barrier rib having small surface roughness.

The softening point can be measured using a differential thermal analyzer (hereinafter referred to as "DTA") and can be determined from a DTA curve, which is obtained by measuring a glass powder by extrapolating the heat absorption completion temperature at an endothermic peak, using a tangent method.

When the barrier rib paste is a photosensitive barrier rib paste, the low-softening point glass powder preferably has a refractive index of 1.45 to 1.65. Light scattering is suppressed by decreasing a difference in a refractive index between the inorganic component and the organic component, thus making it easy to perform patterning of the barrier rib with high accuracy. The refractive index as used herein means a refractive index at a wavelength of 436 nm (g-line of a mercury lamp) at 25° C. measured by the Becke line detection method.

The particle diameter of the low-softening point glass powder varies depending on the shape of the barrier rib to be produced, and a 50% particle diameter (hereinafter referred to as "average particle diameter") $d_{50}$ in a weight distribution curve is preferably 0.1 to 3.0 μm and a maximum particle diameter $d_{max}$ is preferably 20 μm or less.

The respective components constituting the low-softening point glass powder will be described below.

Silicon oxide is a component which forms a glass skeleton. Silicon oxide has the effect of improving denseness, strength, or chemical stability of glass, and also has the effect of decreasing a refractive index of glass. When using a glass substrate as a base material, it is also possible to prevent peeling of a barrier rib due to mis-match with the glass substrate by controlling a thermal expansion coefficient. The content of silicon oxide in the low-softening point glass powder is preferably 30 to 48 mol %, and more preferably 33 to 42 mol %. Control of the content of silicon oxide to 30 mol % or more enables suppression of the thermal expansion coefficient to a small value, and thus it is possible to make it difficult to cause cracking when silicon oxide is baked on a glass substrate. It is also possible to decrease a refractive index. Control of the content of silicon oxide to 48 mol % or less enables a decrease in softening point of glass, leading to a decrease in temperature at which the glass substrate is baked on the glass substrate.

Aluminum oxide has the effect of improving chemical stability of glass. The content of aluminum oxide in the low-softening point glass powder is preferably 2 to 15 mol %, and more preferably 9 to 15 mol % to improve chemical stability of glass.

The alkali metal oxide has the effect of not only making it easy to control thermal expansion coefficient of glass, but also decreasing the softening point. The alkali metal oxide as used herein means lithium oxide, sodium oxide, and potassium oxide, and inclusion of the alkali metal oxide means inclusion of one or more of them. The total value of the content of three alkali metal oxides in the low-softening point glass powder is preferably 7 to 17 mol %, and more preferably 10 to 17 mol %. Control of the content to 7 mol % or more enables a decrease in softening point of glass. Control of the content to 17 mol % or less enables suppression of the thermal expansion coefficient of glass to a small value while maintaining chemical stability of glass, leading to a decrease in refractive index. Since it is possible to reduce yellowing due to migration of silver ions, the content of sodium oxide in the low-softening point glass powder is preferably controlled to 3.5 mol % or less.

Boron oxide is a component which forms a glass skeleton, and has the effect of decreasing a softening point and a refractive index of glass. The content of boron oxide in the low-softening point glass powder must be 24 to 37 mol % so as to suitably maintain balance of a glass composition and chemical stability. To improve chemical stability of glass and to decrease the softening point, leading to a decrease in temperature of baking to a glass substrate and a decrease in refractive index, the content is preferably 24 to 34 mol %, and more preferably 29 to 34 mol %.

The alkali earth metal oxide means magnesium oxide, calcium oxide, strontium oxide, and barium oxide. The alkali earth metal oxide has the effect of not only making it easy to control the thermal expansion coefficient, but also decreasing the softening point. Meanwhile, boron oxide is a component which reacts with an organic component in the barrier rib paste or the barrier rib pattern formation step to cause poor pyrolytic properties of the organic component, and also a carbon residue caused thereby. The reaction between the organic component and the alkali earth metal element is more specifically a salt or ionic crosslinking formation reaction between functional groups such as a hydroxyl group or a carboxyl group, and alkali earth metal ions. Since the alkali earth metal ions are divalent ions and can form strong ionic crosslinking with the organic component, it is estimated that significant influence is exerted on pyrolytic properties of the organic component as compared with other components in glass. Therefore, the total value of the contents of four alkali earth metal element oxides in the glass powder must be 4 mol % or less, preferably 2.9 mol % or less, and more preferably 2 mol % or less.

Zinc oxide has the effect of decreasing the softening point without causing significant change in thermal expansion coefficient of glass. Meanwhile, zinc oxide causes deterioration of paste viscosity stability and thus the content of zinc in the low-softening point glass powder must be 10 mol % or less, and preferably 5 mol % or less.

It is possible to contain, as other components of the low-softening point glass powder, titanium oxide or zirconium hydroxide having the effect of improving chemical stability of glass, or bismuth oxide or lead oxide having the effect of decreasing the softening point.

The method of producing a low-softening point glass powder includes, for example, a method in which raw materials which are constituent components such as lithium oxide, potassium oxide, silicon oxide, boron oxide, zinc oxide, barium oxide, magnesium oxide, and aluminum oxide are mixed in a predetermined content, melted at 900 to 1,200° C. and cooled to give a glass frit, which is crushed and then classified to obtain a fine powder having a diameter of 20 μm or less. It is possible to use, as the raw material, high-purity carbonate, oxide, or hydroxide. Depending on the kind and the composition of the glass powder, when using a homogeneous powder obtained by a sol-gel method using a raw material such as an alkoxide or organic metal having ultra-high purity of 99.99% or more, it is possible to obtain a high-purity fired film which has high electric resistance and is dense, and has little porosity, preferably.

Constituent components of the low-softening point glass powder and the contents thereof can be specified and calculated from the respective raw materials and the contents thereof upon the production of the low-softening point glass powder, and it is also possible to specify and calculated from sample analysis of the low-softening point glass powder, the barrier rib paste or the barrier rib. When the sample is a glass powder, constituent components can be quantitatively determined by performing atomic absorption spectroscopic analysis or inductively coupled plasma (hereinafter referred to as "ICP") atomic spectroscopic analysis. When the sample is a barrier rib, constituent components can be quantitatively determined by Auger electron spectroscopy. More specifically, constituent components can be quantitatively determined by observing a cross-section of a barrier rib using a scanning electron microscope (hereinafter referred to as "SEM"), and distinguishing the low-softening point glass by a difference in light and shade of the SEM image, followed by elemental analysis by Auger electron spectroscopy. When the sample is a barrier rib, it is also possible to secondarily use other known analytical means of selectively scraping the low-softening point glass from the barrier rib and performing atomic absorption spectrometric analysis or ICP atomic emission spectrophotometric analysis. When the sample is a barrier rib paste, the same analysis as that in the glass powder is performed after isolating the glass powder by subjecting the barrier rib paste to the operation such as filtration or washing, or the same analysis as that in the case of the barrier rib after applying and firing the barrier rib paste to form a barrier rib.

From the results of elemental analysis, the method of calculating the content of the constituent component is as follows. In the elemental analysis, since information of a mass ratio of elements contained in the low-softening point glass powder is obtained, it is possible to calculate a mass ratio expressed in terms of oxide, in other words, a mass ratio of constituent components based on the atomic weight, the formula weight of the constituent component, and number of cations in the compositional formula of the constituent component. It is possible to convert the thus obtained mass ratio of the constituent component into a molar ratio based on formula (1):

$$(Ri/Fi)/\Sigma(Ri/Fi) \times 100 \text{ (mol \%)} \quad (1)$$

where Ri: % by mass of constituent component i, Fi: formula weight of constituent component i, Σ: sum of whole components.

To the barrier rib paste, a filler may be added as an inorganic component other than the low-softening point glass powder. The filler as used herein means an inorganic powder which is added so as to improve the strength of the barrier rib, and is less likely to cause melt flow even at a firing temperature. More specifically, the filler means an inorganic powder which has a softening point, a melting point, and a decomposition temperature of 650° C. or higher, and exists as solid at 650° C. The filler includes, for example, a high-softening point glass powders having a softening point of 650 to 1,200° C., or a ceramic powder such as cordierite, alumina, silica, magnesia, or zirconia, and preferably a high-softening point glass powder in view of ease of controlling an average particle diameter $d_{50}$ and a refractive index. In consideration of dispersibility and fillability of the filler into a barrier rib paste, and suppression of light scattering upon exposure, an average particle diameter $d_{50}$ of the filler is preferably 0.1 to 3.0 μm and a maximum particle diameter $d_{max}$ of the filler is preferably 20 μm or less.

When the filler is added as an inorganic component, the content of the low-softening point glass powder in the inorganic component is preferably 50 to 98% by volume. The content of the low-softening point glass powder in the inorganic component of 50% by volume or more leads to easy sintering upon firing, thus making it possible to maintain the porosity of the barrier rib after firing still in a small state. It is preferred that the content of the low-softening point glass powder in the inorganic component is 98% by volume or less since the fluidity of the whole inorganic component upon firing can be controlled, thus enabling prevention of deformation of the shape of the barrier rib, and also the mechanical strength of the barrier rib after firing is improved, thus enabling formation of the barrier rib which is less likely to cause chipping due to impact.

The contents of the low-softening point glass powder and the filler in the inorganic component can be calculated from the contents of the respective raw materials upon the production of a barrier rib paste. Alternatively, a cross-section vertical to a film surface of a barrier rib paste dry film obtained by applying a barrier rib paste, followed by drying, or a barrier rib paste fired film obtained by firing a dry film may be observed by SEM and distinguishing the kind of the inorganic component by a difference in light and shade of the SEM image, followed by image analysis. A relation between the density of the SEM image and the inorganic component can be specified using elemental analysis by X-ray. Target area for evaluation by SEM is an area measuring about 20 µm×100 µm, and can be observed by a magnification of about 1,000 to 3,000 times.

Preferably usable high-softening point glass powders have the following compositions (expressed by oxide).

| | |
|---|---|
| Total amount of lithium oxide, sodium oxide, and potassium oxide | 0 to 5 mol % |
| Silicon oxide | 30 to 70 mol % |
| Boron oxide | 5 to 25 mol % |
| Zinc oxide | 0 to 10 mol % |
| Aluminum oxide | 5 to 25 mol % |
| Titanium oxide | 0 to 5 mol % |
| Total amount of magnesium oxide and calcium oxide | 1 to 20 mol % |
| Total amount of barium oxide and strontium oxide | 0 to 10 mol % |

When the barrier rib paste is a photosensitive barrier rib paste, the filler preferably has a refractive index of 1.45 to 1.65. Light scattering is suppressed by decreasing the difference in refractive index among the filler, the low-melting point glass, and the organic component, thus making it easy to perform patterning of the barrier rib with high accuracy.

The total content of the inorganic component in the solid component of the barrier rib paste is preferably 35 to 80% by volume, and more preferably 40 to 70% by volume. The solid component as used herein means an organic component and inorganic component, excluding the solvent contained in the barrier rib paste. The content of the inorganic component in the solid component of the barrier rib paste of less than 35% by volume leads to an increase in shrinkage of the barrier rib pattern due to firing. The content of more than 80% by volume makes it difficult to perform uniform coating.

The content of the inorganic component (% by volume) in the solid component can be controlled by the addition ratio (% by mass) in consideration of density of the inorganic component and the organic component upon the preparation of a barrier rib paste. Examples of the method of analyzing the content of the inorganic component include a method of determining by thermogravimetric analysis (hereinafter referred to as "TGA"), measurement of the density of a barrier rib paste dry film, and measurement of the density of a barrier rib paste fired film, and a method of determining by image analysis of images observed by a transmission electron microscope (hereinafter referred to as "TEM") using a barrier rib paste dry film obtained by applying a barrier rib paste, followed by drying. In making a determination by TGA, the measurement of the density of a barrier rib paste dry film, and the measurement of the density of a barrier rib paste fired film, for example, a change in weight at room temperature to 600° C. is evaluated by TGA (e.g., TGA-50; manufactured by SHIMADZU CORPORATION) using about 10 mg of a barrier rib paste as the sample. Since the solvent in the barrier rib paste is usually vaporized at 100 to 150° C., a mass ratio of the inorganic component to the organic component is determined from the proportion of the weight after temperature was raised to 600° C. (which corresponds to the weight of the inorganic component since the organic component is removed) to the weight after vaporization of the solvent. Meanwhile, when the density of the dry film is evaluated based on the film thickness, the area, and the mass of the barrier rib paste dry film, and the density of the inorganic component is evaluated based on the film thickness, the area, and the mass of the barrier rib paste fired film, the content of the inorganic component (% by volume) can be evaluated. When the content is determined by TEM observation, a cross-section vertical to a film surface of a barrier rib paste dry film may be observed by TEM (JEM-4000EX, manufactured by JEOL, Ltd.), and distinguishing the inorganic component from the organic compound by a difference in light and shade of the image, followed by image analysis. Target area for evaluation by TEM is an area measuring about 20 µm×100 µm, and can be observed by a magnification of about 1,000 to 3,000 times.

The barrier rib paste contains the organic component. It is possible to appropriately select, as the organic component, an organic component which has an appropriate viscosity when a barrier rib paste is applied, and also retains a barrier rib pattern shape when the barrier rib paste is applied, followed by drying, as required, by a barrier rib formation process. Examples of the organic component include a cellulose compound typified by ethyl cellulose, an acrylic copolymer typified by polyisobutyl methacrylate, or a resin such as polyvinyl alcohol, polyvinyl butyral, or α-methyl-styrene polymer.

When the barrier rib paste is a photosensitive barrier rib paste, it includes a photosensitive organic component. Examples of the photosensitive organic component include a photosensitive monomer, a photosensitive oligomer, or a photosensitive polymer. It is possible to add organic components such as a non-photosensitive polymer component, an antioxidant, an organic dye, a photo-polymerization initiator, a sensitizer, an auxiliary sensitizer, a plasticizer, a thickener, a dispersing agent, an organic solvent, or suspending agent, as required. When the barrier rib paste is used to form a high-definition barrier rib such as a barrier rib of a plasma display panel, the paste is preferably a photosensitive barrier rib paste containing a photosensitive organic component as the organic component.

The photosensitive barrier rib paste as used herein means a barrier rib paste in which the reaction such as photocrosslinking, photopolymerization, photodepolymerization, or photomodification occurs when a coating film is irradiated with active rays after application and drying, leading to a change in chemical structure of the irradiated portion, thus enabling the development with a developing solution. The irradiated portion becomes insoluble in the developing solution by irradiation with active rays, and then only the non-irradiated portion is removed with the developing solution to prepare a negative photosensitive barrier rib paste capable of forming a barrier rib pattern, and thus satisfactory properties can be obtained. Active rays as used herein mean rays having a wavelength within a range of 250 to 1,100 nm, capable of causing such chemical reaction, and specific examples thereof include ultraviolet rays of an ultrahigh pressure mercury lamp, a metal halide lamp, and the like; visible rays of a halogen lamp, or the like; and laser beams having a specific wavelength of a helium-cadmium laser, a helium-neon laser, an argon ion laser, a semiconductor laser, YAG laser, a carbon dioxide laser, and the like.

The photosensitive polymer is preferably an alkali-soluble polymer. The reason is that an aqueous alkali solution can be used as a developing solution in place of an environmentally hazardous organic solvent since the photosensitive polymer has alkali-solubility. The alkali-soluble polymer is preferably an acrylic copolymer containing, as a constituent monomer, an unsaturated acid such as an unsaturated carboxylic acid. The acrylic copolymer as used herein means a copolymer containing, as a copolymerization component, at least an acrylic monomer. Examples of the acrylic monomer include acrylic monomers such as methyl acrylate, ethyl acrylate, n-propyl acrylate, isopropyl acrylate, n-butyl acrylate, sec-butyl acrylate, isobutyl acrylate, tert-butyl acrylate, n-pentyl acrylate, allyl acrylate, benzyl acrylate, butoxyethyl acrylate, butoxytriethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, 1-naphthyl acrylate, 2-naphthyl acrylate or thiophenol acrylate, and benzylmercaptan acrylate; or those in which these acrylates are replaced by methacrylates. It is possible to use, as the copolymerization component other than the acrylic monomer, a compound having a carbon-carbon double bond, and examples of the compound include styrenes such as styrene, o-methylstyrene, m-methylstyrene, p-methylstyrene, α-methylstyrene, chloromethylstyrene, or hydroxymethylstyrene; 1-vinyl-2-pyrrolidone or vinyl acetate.

Examples of the unsaturated acid imparting alkali-solubility include acrylic acid, methacrylic acid, itaconic acid, crotonic acid, maleic acid, or fumaric acid, or acid anhydrides thereof. The alkali-soluble polymer preferably has an acid value of 50 to 150.

When using the acrylic copolymer, it is preferred to use an acrylic copolymer having a carbon-carbon double bond in the side chain or molecular end to increase a reaction rate of the curing reaction due to exposure of the photosensitive barrier rib paste. Examples of the group having a carbon-carbon double bond include a vinyl group, an allyl group, an acrylic group, or a methacrylic group. To add such a functional group to the acrylic copolymer, it is possible to use a method in which a compound having a glycidyl group or an isocyanate group and a carbon-carbon double bond, or acrylic acid chloride, methacrylic acid chloride, or allyl chloride is added to a mercapto group, an amino group, a hydroxyl group, or a carboxyl group in the acrylic copolymer, thereby reacting them.

Examples of the compound having a glycidyl group and a carbon-carbon double bond include glycidyl methacrylate, glycidyl acrylate, allyl glycidyl ether or glycidyl ethyl acrylate, crotonyl glycidyl ether, glycidyl crotonate, and glycidyl isocrotonate. Examples of the compound having an isocyanate group and a carbon-carbon double bond include acryloyl isocyanate, methacryloyl isocyanate, acryloylethyl isocyanate, or methacryloylethyl isocyanate.

The photosensitive barrier rib paste may further contain, as the organic component, non-photosensitive polymer components, for example, cellulose compounds such as methyl cellulose and ethyl cellulose, high-molecular weight polyethers, and the like.

The photosensitive monomer means a compound having a carbon-carbon double bond, and examples thereof include methyl acrylate, ethyl acrylate, n-propyl acrylate, isopropyl acrylate, n-butyl acrylate, sec-butyl acrylate, isobutyl acrylate, tert-butyl acrylate, n-pentyl acrylate, allyl acrylate, benzyl acrylate, butoxyethyl acrylate, butoxytriethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, allylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, acrylamide, aminoethyl acrylate, phenyl acrylate, phenoxyethyl acrylate, benzyl acrylate, 1-naphthyl acrylate, 2-naphthyl acrylate, bisphenol A diacrylate, diacrylate of a bisphenol A-ethylene oxide adduct, diacrylate of a bisphenol A-propylene oxide adduct, thiophenol acrylate, or benzylmercaptan acrylate, or monomers in which 1 to 5 hydrogen atoms of the aromatic ring of these monomers are replaced by a chlorine or bromine atom, or styrene, p-methylstyrene, o-methylstyrene, m-methylstyrene, chlorinated styrene, brominated styrene, α-methylstyrene, chlorinated α-methylstyrene, brominated α-methylstyrene, chloromethylstyrene, hydroxymethylstyrene, carboxymethylstyrene, vinylnaphthalene, vinylanthracene, or vinylcarbazole. The photosensitive monomer further includes those in which acrylates in the molecule of the above-mentioned compound having a carbon-carbon double bond are partially or entirely replaced by methacrylates, y-methacryloxypropyltrimethoxysilane, or 1-vinyl-2-pyrrolidone. In the polyfunctional monomer, an acrylic group, a methacrylic group, a vinyl group, or an allyl group may coexist.

It is preferred that the photosensitive barrier rib paste further contains a urethane compound. When the photosensitive barrier rib paste contains a urethane compound, flexibility of a photosensitive barrier rib paste dry film is improved, thus making it possible to reduce stress upon firing and to effectively suppress defects such as cracking and wire breakage. When the photosensitive barrier rib paste contains a urethane compound, pyrolytic properties are improved and the organic component is less likely to be left in the firing step. The urethane compound includes, for example, a compound represented by formula (1):

$$R^1\text{-}[R^4\text{-}R^3]_n\text{-}R^4\text{-}R^2 \tag{1}$$

wherein $R^1$ and $R^2$ are selected from the group consisting of a substituent having an ethylenically unsaturated group, hydrogen, an alkyl group having 1 to 20 carbon atoms, an aryl group, an aralkyl group, and a hydroxyaralkyl group, and each may be the same or different, $R^3$ is an alkylene oxide group or an alkylene oxide oligomer, $R^4$ is an organic group including a urethane bond, and n is an integer of 1 to 10.

Such urethane compound is preferably a compound including an ethylene oxide unit. More preferably, the urethane compound is a compound of formula (1) in which $R^4$ is an oligomer including an ethylene oxide unit (hereinafter referred to as "EO") and a propylene oxide unit (hereinafter referred to as "PO") and also the content of EO in the oligomer is within a range from 8 to 70% by mass. The content of EO of 70% by mass or less leads to a further improvement in flexibility and a decrease in firing stress, thus enabling effective suppression of defects. Furthermore, pyrolytic properties are improved and the organic compound is less likely to be left in the subsequent firing step. The content of EO of 8% or more leads to an improvement in compatibility with other organic components.

It is also preferred that the urethane compound has a carbon-carbon double bond. When the carbon-carbon double bond of the urethane compound reacts with the carbon-carbon double bond of other crosslinking agents, thereby introducing into a crosslinked compound, polymerization shrinkage can be further suppressedd.

Examples of the urethane compound include UA-2235PE (molecular weight of 18,000, EO content of 20%), UA-3238PE (molecular weight of 19,000, EO content of 10%), UA-3348PE (molecular weight of 22,000, EO content of 15%), or UA-5348PE (molecular weight of 39,000, EO content of 23%) (all of which are manufactured by SHIN NAKAMURA CHEMICAL Co., Ltd.), or a mixture thereof.

The content of the urethane compound in the organic component excluding the solvent is preferably 0.1 to 20% by mass. The content of 0.1% by mass or more enables an improvement in flexibility of the barrier rib paste dry film, thus making it possible to relive firing shrinkage stress in the case of firing the barrier rib paste dry film. The content of more than 20% by mass leads to deterioration of dispersibility of the organic component and the inorganic component and a relative decrease in concentration of the monomer and the photo-polymerization initiator, and thus defects are likely to occur.

The photo-polymerization initiator is preferably a photo-radical initiator which generates a radical by irradiation with light of an active light source. Examples of the photoradical initiator include benzophenone, methyl o-benzoylbenzoate, 4,4-bis(dimethylamino)benzophenone, 4,4-bis(diethylamino)benzophenone, 4,4-dichlorobenzophenone, 4-benzoyl-4-methyl diphenyl ketone, dibenzyl ketone, fluorenone, 2,2-diethoxyacetophenone, 2,2-dimethoxy-2-phenyl acetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberon, methyleneanthrone, 4-azidobenzalacetophenone, 2,6-bis(p-azidobenzylidene)cyclohexanone, 2,6-bis(p-azidobenzylidene)-4-methylcyclohexanone, 2-phenyl-1,2-butadion-2-(o-methoxycarbonyl) oxime, 1-phenyl-propanedion-2-(o-ethoxycarbonyl) oxime, 1,3-diphenyl-propanetrione-2-(o-ethoxycarbonyl) oxime, 1-phenyl-3-ethoxy-propanetrione-2-(o-benzoyl) oxime, Michler's ketone, 2-methyl[4-(methylthio)phenyl]-2-morpholino-1-propanone, naphthalene sulfonyl chloride, 2-benzyl-2-dimethylamino-1-(4-morpholinophenyl)-1-butanone, quinolinesulfonyl chloride, N-phenylthioacridone, 4,4-azobisisobutyronitrile, diphenyl disulfide, benzothiazole disulfide, triphenylphosphine, camphorquinone, carbon tetrabromide, tribromophenylsulfone or benzoin peroxide or eosin, or a combination of a photoreducing pigment such as methylene blue and a reducing agent such as ascorbic acid or triethanolamine. The photopolymerization initiator is added in the proportion of 0.05 to 20% by mass, and more preferably 0.1 to 18% by mass, based on the total amount of the photosensitive monomer and the photosensitive polymer. Too small amount of the photopolymerization initiator may lead to poor photosensitivity, whereas, too large amount of the photopolymerization initiator may lead to too small retention rate of the exposed portion.

Use of the sensitizer together with the photo-polymerization initiator enables an improvement in sensitivity and an enlargement in wavelength range effective for the reaction. Examples of the sensitizer include 2,4-dimethylthioxanthone, 2,4-diethylthioxanthone, 2-isopropylthioxanthone, 2,3-bis(4-diethylaminobenzal)cyclopentanone, 2,6-bis(4-dimethylaminobenzal)-4-methylcyclohexanone, Michler's ketone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminobenzal)acetone, 1,3-carbonylbis(4-diethylaminobenzal)acetone, 3,3-carbonylbis-(7-diethylaminocoumarin), triethanolamine, methyldiethanolamine, triisopropanolamine, N-phenyl-N-ethylethanolamine, N-phenylethanolamine, N-tolyldiethanolamine, methyl 4-dimethylaminobenzoate, ethyl 4-dimethylaminobenzoate, amyl dimethylaminobenzoate, isoamyl diethylaminobenzoate, (2-dimethylamino)ethyl benzoate, (n-butoxy)ethyl 4-dimethylaminobenzoate, 2-ethylhexyl 4-dimethylaminobenzoate, 3-phenyl-5-benzoylthiotetrazole, or 1-phenyl-5-ethoxycarbonylthiotetrazole. Among sensitizers, some sensitizers can also be used as the photopolymerization initiator. When the sensitizer is added to the photosensitive barrier rib paste, the sensitizer is preferably added in the proportion of 0.05 to 10% by mass, and more preferably 0.1 to 10% by mass, based on the total amount of the photosensitive monomer and the photosensitive polymer. Control of the amount of the sensitizer added within the above range makes it possible to obtain satisfactory photosensitivity while maintaining the retention rate of the exposed portion.

The antioxidant may be added to the photosensitive barrier rib paste. The antioxidant as used herein means a compound having a radical chain inhibiting action, a triplet scavenging action, and a hydroperoxide decomposing action. When the antioxidant is added to the photosensitive paste, the antioxidant scavenges a radical and returns an excited energy state of a photopolymerization initiator to a ground state. Whereby, unnecessary photoreaction due to scattered light is suppressed, thus making it possible to increase dissolution contrast in a developing solution. Examples of the antioxidant include p-benzoquinone, naphthoquinone, p-xyloquinone, p-toluquinone, 2,6-dichloroquinone, 2,5-diacetoxy-p-benzoquinone, 2,5-dicaproxy-p-benzoquinone, hydroquinone, p-t-butylcatechol, 2,5-dibutylhydroquinone, mono-t-butylhydroquinone, 2,5-di-t-amylhydroquinone, di-t-butyl-p-cresol, hydroquinonemonomethyl ether, α-naphthol, hydrazine hydrochloride, trimethylbenzylammonium chloride, trimethylbenzylammonium oxalate, phenyl-β-naphthylamine, parabenzylaminophenol, di-β-naphthylparaphenylenediamine, dinitrobenzene, trinitrobenzene, picric acid, quinonedioxime, cyclohexanoneoxime, pyrogallol, tannic acid, triethylamine hydrochloride, dimethylaniline hydrochloride, cupferron, 2,2'-thiobis(4-t-octylphenolate)-2-ethylhexylamine nickel(II), 4,4'-thiobis-(3-methyl-6-t-butylphenol), 2,2'-methylenebis-(4-methyl-6-t-butylphenol), triethylene glycol-bis[3-(t-butyl-5-methyl-4-hydroxyphenyl)propionate], 1,6-hexanediol-bis[(3,5-di-t-butyl-4-hydroxyphenyl)propionate], or 1,2,3-trihydroxybenzene. The antioxidant is preferably added in the proportion of 0.01 to 30% by mass, and more preferably 0.05 to 20% by mass, based on the total amount of the photosensitive monomer and the photosensitive polymer. When the additive amount of the antioxidant is adjusted within the above range, it is possible to maintain photosensitivity of the photosensitive barrier rib paste, and to ensure large contrast between the exposed portion and the non-exposed portion while maintaining the polymerization degree and a pattern shape.

The ultraviolet ray absorber may be added to the photosensitive barrier rib paste. The addition of the ultraviolet ray absorber enables absorption of scattered light inside the barrier rib paste due to exposure, thus making it possible to reduce the intensity of scattered light. The ultraviolet ray absorber as used herein means a compound which is excellent in light absorption properties of a wavelength close to g-line, h-line, and i-line, and examples thereof include benzophenone-based compounds, cyanoacrylate-based compounds, salicylic acid-based compounds, benzotriazole-based compounds, indole-based compound, or fine inorganic metal oxide particles, of which benzophenone-based compounds, cyanoacrylate-based compounds, benzotriazole-based compounds, or indole-based compounds are preferable. Examples of benzophenone-based compounds include 2,4-dihydroxybenzophenone, 2-hydroxy-4-methoxybenzophenone, 2,2'-dihydroxy-4,4'-dimethoxybenzophenone, 2,2'-dihydroxy-4,4'-dimethoxy-5-sulfobenzophenone, 2-hydroxy-4-methoxy-2'-carboxybenzophenone, 2-hydroxy-4-methoxy-5-sulfobenzophenone trihydrate, 2-hydroxy-4-n-octoxybenzophenone, 2-hydroxy-4-octadecyloxybenzophenone, 2,2',4,4'-tetrahydroxybenzophenone, 4-dodecyloxy-2-hydroxybenzophenone, 2-hydroxy-4-(2-hydroxy-3-methacryloxy)propoxybenzophenone, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-4'-n-octoxyphenyl)benzotriazole, 2-ethylhexyl-2-cyano-3,3-diphenyl acrylate, or 2-ethyl-2-cyano-3,3-diphenyl acrylate, BONASORB UA-3901, BONASORB UA-3902, BONASORB UA-3911, or SOM-2-0008 (all of which are manufactured by ORIENT CHEMICAL INDUSTRIES Co., Ltd.) which are indole-based ultraviolet ray absorbers, or Basic Blue, Sudan Blue, Sudan R, Sudan I, Sudan II, Sudan III, Sudan IV, Oil Orange SS, Oil Violet, or Oil Yellow OB (all of which are manufactured by Aldrich Corporation), or reactive ultraviolet ray absorbers in which a methacryl group or the like is introduced into the skeleton of these ultraviolet ray absorbers.

A photofading compound may be used as the ultraviolet ray absorber. The photofading compound as used herein means a compound which absorbs light having a wavelength range of active rays when irradiated with light having a wavelength range of active rays, thus reducing an absorbance at a wavelength range of an active light source as compared with that before irradiation with light through a change in chemical structure, such as photodegradation or photomodification. In a photosensitive paste method, since exposure is usually performed employing g-line (436 nm), h-line (405 nm), and i-line (365 nm) of an ultrahigh-pressure mercury lamp, it is preferred that the photofading compound has an absorption in the g-line, h-line, and i-line ranges. The addition of the photofading compound to the photosensitive barrier rib paste enables prevention of penetration of exposure light into the non-exposed portion, thus making it possible to suppress bottom thickening of a barrier rib pattern in view of barrier rib pattern design. In the exposed portion, since the photofading compound absorbs energy of exposure and will not gradually absorb light through photodegradation and photomodification, exposure light is likely to sufficiently reach the lower layer. Therefore, the contrast between the non-exposed portion and the exposed portion becomes clear, thus enabling an indisputable improvement in exposure margin. Examples of the photofading compound include photodegradable compounds such as a photofading dye, a photo acid generator, a photobase generator, or a nitrone compound; or photomodified compounds such as an azo-based dye or a photochromic compound. Examples of the photo acid generator include an onium salt, a halogen-containing compound, a diazomethane compound, a sulfone compound, a sulfonic acid ester compound, a sulfoneimide compound, or a diazoketone compound.

The ultraviolet ray absorber is preferably added in the proportion of 0.001 to 20% by mass, and more preferably 0.01 to 10% by mass, based on the total amount of the photosensitive monomer and the photosensitive polymer. When the amount of the ultraviolet ray absorber is adjusted within the above range, it is possible to suppress bottom thickening of a barrier rib pattern by absorption of scattered light, thus maintaining sensitivity to exposure light.

An organic dye may be added to the photosensitive barrier rib paste as a mark of exposure and development. Coloration caused by the addition of the organic dye leads to improved visibility, thus making it easy to distinguish the portion where the barrier rib paste is left from the portion where the barrier rib paste is removed, upon development. The organic dye is preferably an organic dye which is not left in an insulating film after firing. Examples of the organic dye, which is not left in an insulating film after firing, include anthraquinone-based dyes, indigoid-based dyes, phthalocyanine-based dyes, carbonium-based dyes, quinoneimine-based dyes, methine-based dyes, quinoline-based dyes, nitro-based dyes, nitroso-based dyes, benzoquinone-based dyes, naphthoquinone-based dyes, phthalimide-based dyes, or perinone-based dyes, of which carbonium-based dyes capable of absorbing light having a wavelength close to h-line and i-line, such as Basic Blue are preferable. The organic dye is preferably added in the proportion of 0.001 to 1% by mass based on the total amount of the photosensitive monomer and the photosensitive polymer.

It is also preferred to add the organic solvent to adjust the viscosity of a barrier rib paste when applied to a substrate according to a coating method. Examples of the organic solvent include methyl cellosolve, ethyl cellosolve, butyl cellosolve, butyl carbitol, ethyl carbitol, butyl carbitol acetate, ethyl carbitol acetate, methyl ethyl ketone, dioxane, acetone, cyclohexanone, cyclopentanone, isobutyl alcohol, isopropyl alcohol, tetrahydrofuran, dimethyl sulfoxide, γ-butyrolactone, bromobenzene, chlorobenzene, dibromobenzene, dichlorobenzene, bromobenzoic acid, or chlorobenzoic acid.

The photosensitive paste is prepared by mixing the respective components of an inorganic component with the respective components of an organic component so as to obtain a predetermined composition, followed by regular kneading using a kneader such as a three-roller. It is also preferred that the barrier rib paste after completion of regular kneading is appropriately filtered and degassed.

The method of manufacturing a member including a barrier rib applies the above-mentioned barrier rib paste on a substrate, followed by firing to form a barrier rib. Whereby, it is possible to obtain a barrier rib which contains less carbon residue after firing and is free from coloration, thus making it possible to obtain a member including a barrier rib such as a high-reliability planar display panel or scintillator panel, the member being excellent in display characteristics such as luminance.

The method of manufacturing a member including a barrier rib applies the above-mentioned barrier rib paste on a substrate, followed by exposure, development, and firing to form a barrier rib. Whereby, it is possible to form not only a barrier rib which contains less carbon residue after firing and is free from coloration, but also a high-definition barrier rib with high accuracy, thus making it possible to stably obtain a member including a barrier rib such as a high-reliability planar display panel or scintillator panel, the member being excellent in display characteristics such as luminance at low costs.

The member including a barrier rib includes a low-softening point glass as a main component, wherein the low-softening point glass contains silicon oxide, aluminum oxide, an alkali metal oxide, and 24 to 37 mol % of a boron oxide, and the content of an alkali earth metal oxide is 4 mol % or less and the content of zinc oxide is 10 mol % or less.

When the composition of the low-softening point glass as a main component of the barrier rib is adjusted within the above range, it is possible to obtain a member including a barrier rib such as a high-reliability planar display panel or scintillator panel, the member being excellent in display characteristics such as luminance. The content of boron oxide in the low-softening point glass component is preferably 24 to 34 mol %, and more preferably 29 to 34 mol %. The content of the alkali earth metal oxide in the low-softening point glass component is preferably 2.9 mol % or less, and more preferably 2% or less. The content of zinc oxide in the low-softening point glass component is preferably 5% or less.

Furthermore, the content of silicon oxide in the low-softening point glass component is preferably 30 to 48 mol %, and more preferably 34 to 37 mol %. The content of aluminum oxide in the low-softening point glass component is preferably 2 to 15 mol %, and more preferably 13 to 15 mol %. The content of the alkali metal oxide in the low-softening point glass component is preferably 7 to 17 mol%, and more preferably 10 to 17 mol %. The content of sodium oxide in the low-softening point glass component is preferably low-softening point glass is preferably 3.5 mol % or less.

The main component as used herein means a component having the maximum volume fraction of solid components of the entire barrier rib. The content of the low softening point glass can be determined by observing a cross-section of the barrier rib using an electron microscope and image analyzing the proportion of a cross-sectional area of the low softening point glass in the total cross-sectional area of the solid component. It is possible to distinguish the low softening point glass from other solid components by a difference in light and shade of the image. It is also possible to strictly distinguish the component by mapping an atom using a technique such as SEM equipped with an energy dispersive X-ray fluorescence spectrometer (SEM-EDX).

The constituent components and the contents thereof of the low-softening point glass as a main component of the barrier rib can be quantitatively determined by Auger electron spectroscopy analysis. Specifically, the low-softening point glass is distinguished by a difference in light and shade of the SEM image of a cross-section of the barrier rib, followed by elemental analysis using Auger electron spectroscopy. It is also possible to secondarily use other known analytical means of selectively scraping the low softening point glass from the barrier rib, and performing atomic absorption spectroscopic analysis and ICP atomic emission spectroscopic analysis.

The softening point of the low-softening point glass as a main component of the barrier rib can be measured using DTA after selectively scraping the low softening point glass from the barrier rib. It is possible to determine the heat absorption completion temperature at an endothermic peak from a DTA curve obtained as a result of the measurement, by extrapolation using a tangent method.

The procedure of producing a plasma display panel member and a plasma display panel using a photosensitive paste method will be described below as the procedure of producing a member including a barrier rib, but is not limited thereto. A basic structure of a flat-panel display member will be described below by way of the most common alternating current (AC) type plasma display panel as an example.

A plasma display panel is a member obtained by sealing the front glass substrate and the rear glass substrate so that a phosphor layer formed on the front glass substrate and/or the rear glass substrate is in contact with the internal space, i.e. the discharge space, and sealing a discharge gas such as Xe—Ne or Xe—Ne—He in the discharge space. In the front glass substrate, transparent electrodes (sustain electrode, scan electrode) for display discharge is formed on the substrate of the display surface side. For the purpose of forming a lower resistance electrode, a bus electrode may be formed on the rear glass substrate side of a transparent electrode. The bus electrode is sometimes opaque since it is made of materials such as Ag or Cr/Cu/Cr. The bus electrode disturbs display of a cell and is therefore preferably provided on the outer peripheral portion of the display surface. In an AC type plasma display panel, a transparent dielectric layer is often formed on the upper layer of the electrode and an MgO thin film is often formed as a protective film thereof. On the rear glass substrate, an electrode (address electrode) for address selection of a cell to be displayed is formed. A barrier rib to partition the cell and a phosphor layer may be formed on both of the front glass substrate and rear glass substrate, and are often formed only on the rear glass substrate.

First, the method of producing a front plate will be described below with regard to the panel production process. It is possible to use, as the glass substrate having a thickness of 1 to 5 mm, a soda glass PP8 (manufactured by NIPPON ELECTRIC GLASS Co., Ltd.) and a heat-resistant glass for a plasma display panel PD200 (manufactured by ASAHI GLASS Co., Ltd.).

First, a pattern is formed on a glass substrate by sputtering indium-tin oxide (ITO) using a photoetching method. Then, a black electrode paste for black electrode is printed. The black electrode paste contains an organic binder, a black pigment, and a conductive powder as main component, and further contains a photosensitive component as the main component when used in a photolithographic method. Metal oxide is preferably used as the black pigment. Examples of the metal oxide include titanium black, oxide of copper, iron, or manganese, or complex oxide thereof, or cobalt oxide, of which cobalt oxide is preferable in view of the fact that fading is less likely occur when fired after mixing with glass. Examples of the conductive powder include a metal powder or a metal oxide powder. Examples of the metal powder include gold, silver, copper, or nickel which is commonly used as the electrode material. Since this black electrode has high resistivity, a bus electrode is produced using an electrode having low resistivity. Therefore, a paste for electrode having high conductivity used in the address electrode (for example, a paste containing silver as a main component) is printed on a printing surface of the black electrode paste. Then, a bus electrode pattern is formed by collective exposure/development. In order to surely ensure conductivity, an electrode paste having high conductivity may be printed again before development, followed by reexposure and further collective development. After formation of the bus electrode pattern, firing is performed. Thereafter, a black stripe and a black matrix are preferably formed so as to improve contrast. It is preferred that the black electrode paste and the conductivity paste have a film thickness within a range of 1 to 5 µm, respectively, after firing. After firing, the line width is preferably 20 to 100 µm.

Next, a transparent dielectric layer is formed using a transparent dielectric paste. The transparent dielectric paste contains an organic binder, an organic solvent, and glass as main components and additives such as a plasticizer may be appropriately added. The method of forming a transparent dielectric layer includes, for example, a method in which a transparent dielectric paste is entirely or partially applied on an electrode-forming substrate by screen printing, a bar coater, a roll coater, a die coater, a blade coater, or a spin coater, and then dried using a ventilation oven, a hot plate, an infrared rays drying furnace, or vacuum drying to form a thick film; or a method in which a transparent dielectric paste is formed into a green sheet, which is laminated on an electrode-forming substrate. The transparent dielectric layer preferably has a thickness of 10 to 30 µm.

Next, firing is performed in a firing furnace. Although firing atmosphere and temperature vary depending on the kinds of the paste and the substrate, firing is performed in air, or under atmosphere of nitrogen or hydrogen. It is possible to use, as the firing furnace, a batch type firing furnace or a roller conveyor type continuous firing furnace. The firing temperature is preferably the temperature at which a resin to be used is sufficiently pyrolyzed. When using an acrylic resin, firing is usually performed at 430 to 650° C. Too low firing temperature may cause formation of the residue of the resin component, whereas, too high firing temperature may cause distortion of a glass substrate, resulting in breakage.

Furthermore, a protective film is formed. Examples of the component of the protective film include MgO, $MgGd_2O_4$, $BaGd_2O_4$, $Sr0.6Ca_{0.4}Gd_2O_4$, $Ba_{0.6}Sr_{0.4}Gd_2O_4$, $SiO_2$, $TiO_2$, $Al_2O_3$, or low-softening point glass, of which MgO is preferable. The method of forming a protective film includes, for example, an electron beam deposition method, or an ion plating method.

Subsequently, the method of producing a rear plate will be described. It is possible to use, as the glass substrate, soda glasses PD220 and PP8, similar to the case of the front glass substrate. On the glass substrate, a stripe-shaped electrode pattern for an address electrode is formed using metals such as silver, aluminum, chromium and nickel. Examples of the method of forming a stripe-shaped electrode pattern include a method in which an electrode paste containing a metal powder and an organic binder as main components is pattern-printed by screen printing, a photosensitive paste method in which a photosensitive electrode paste using a photosensitive organic component as an organic binder is applied and pattern exposure is performed using a photomask, and the unnecessary portion is dissolved and removed in the developing step, followed by heating and firing usually at 350 to 600° C. to form an electrode, and an etching method in which chromium and aluminum are vapor-deposited on a glass substrate and a resist is applied, and then the resist is pattern-exposed and developed and the unnecessary portion is removed by etching. It is preferred to further provide a dielectric layer on an address electrode since it is possible to improve stability of discharge and to suppress collapse or peeling of a barrier rib formed on the dielectric layer. Examples of the method of forming a dielectric layer include a method in which a dielectric paste containing an inorganic component such as a low softening point glass powder or a high softening point glass powder, and an organic binder as main components is full-printed or coated by screen printing, a slit die coater, and the like.

The method of forming a barrier rib by a photosensitive barrier rib paste method will be described below. The barrier rib pattern is preferably a grid-like or waffle-shaped pattern. First, a photosensitive barrier rib paste is applied on a glass substrate with a dielectric layer formed thereon. Examples of the coating method include a coating method using a bar coater, a roll coater, a slit die coater, a blade coater, or screen printing. The coating thickness can be determined taking the height of a desired barrier rib and the shrinkage ratio by firing of a paste into consideration. The coating thickness can be adjusted by the number of coating, mesh of a screen, or viscosity of the barrier rib paste. It is preferred that the height of the barrier rib is adjusted to 100 µm or more since it is possible to ensure sufficient discharge space and to improve luminance of a plasma display panel by widening the coating range of a phosphor.

The coated photosensitive paste coating is dried and then subjected to exposure. Exposure is commonly performed through a photomask, as is performed in conventional photolithography. A direct writing method by laser beams without using a photomask may be used. Examples of exposure equipment include a stepper exposure equipment, or a proximity exposure equipment. Examples of active rays used in the case of exposure include near infrared rays, ultraviolet rays, electron beams, X-rays, or laser beams, of which ultraviolet rays are preferred. Examples of the light source include a low-pressure mercury lamp, a high-pressure mercury lamp, an ultrahigh pressure mercury lamp, a halogen lamp, or a germicidal lamp, of which an ultrahigh pressure mercury lamp is preferred. Exposure conditions vary depending on the coating thickness of the photosensitive barrier rib paste, and exposure is usually performed for 0.01 to for 30 minutes using an ultrahigh pressure mercury lamp with an output of 1 to 100 mW/cm$^2$.

After exposure, development is performed utilizing a difference in solubility in a developing solution between the exposed portion and the non-exposed portion. Examples of the developing method include a dipping method, a spraying method, or a brushing method. It is possible to use, as a developing solution, an organic solvent capable of dissolving an organic component in a photosensitive barrier rib paste. When a compound having an acidic group such as a carboxyl group exists in the photosensitive barrier rib paste, development can be performed using an aqueous alkali solution. Examples of the aqueous alkali solution include sodium hydroxide, sodium carbonate, or an aqueous potassium hydroxide solution. Alternatively, it is possible to use, as an organic alkali, common amine compounds such as tetramethylammonium hydroxide, trimethylbenzylammonium hydroxide, monoethanolamine, or diethanolamine.

The concentration of the aqueous alkali solution is preferably 0.05 to 5% by mass, and more preferably 0.1 to 1% by mass since too low concentration makes it difficult to remove the soluble portion, while too high concentration may cause peeling or corrosion of a barrier rib pattern. The development temperature is preferably 20 to 50° C. from the viewpoint of process control.

The barrier rib may be composed of two or more layers. The structure composed of two or more barrier rib layers enables three-dimensional enlargement of the constitution range of the shape of the barrier rib. For example, in a two-layered structure, it is possible to form a barrier rib having a double cross structure on different levels by applying to form a first layer, exposing in a striped shape, applying to form a second layer, and exposing in a striped shape in a direction perpendicular to the first layer, followed by development. Then, firing is performed by maintaining in a firing furnace at the temperature of 570 to 620° C. for 10 to 60 minutes to form a barrier rib.

A barrier rib pattern may be formed on an unfired electrode pattern and a dielectric layer, followed by collective firing to form an electrode, a dielectric, and a barrier rib.

Next, a phosphor is formed using a phosphor paste. Examples of the method of forming a phosphor include a photolithographic method, a dispenser method, or a screen printing method. The thickness of the phosphor is preferably 10 to 30 µm, and more preferably 15 to 25 µm. A phosphor powder as a component of the phosphor paste is preferably the following phosphor in view of emission intensity, chromaticity, color balance, or lifetime. In the case of a blue color, an aluminate phosphor (for example, $BaMgAl_{10}O_{17}$:Eu) obtained by activating divalent europium, and $CaMgSi_2O_6$ are preferable. In the case of a green color, $Zn_2SiO_4$:Mn, $YBO_3$:Tb, $BaMg_2Al_{14}O_{24}$:Eu, Mn, $BaAl_{12}O_{19}$:Mn, or $BaMgAl_{14}O_{23}$:Mn is preferable, and $Zn_2SiO_4$:Mn is more preferable in view of panel luminance. In the case of a red color, similarly, $(Y, Gd)BO_3$:Eu, $Y_2O_3$:Eu, YPVO:Eu, or $YVO_4$:Eu is preferable, and $(Y, Gd)BO_3$:Eu is more preferable. When the phosphor is formed through the firing step, formation of the dielectric layer mentioned above may be performed simultaneously with firing of the dielectric layer and barrier rib mentioned above.

The method of producing a plasma display panel will be described below. After sealing a rear plate and a front plate, vacuum exhaustion was performed while heating a discharge space formed between two glass substrates, and a discharge gas composed of He, Ne, or Xe was charged, followed by sealing. In view of both discharge voltage and luminance, the discharge gas is preferably a Xe-Ne mixed gas containing 5 to 15% by volume of Xe. To increase generation efficiency of ultraviolet rays, the content of Xe may be further increased to about 30% by volume.

Finally, a plasma display panel can be produced by mounting a drive circuit, followed by aging.

EXAMPLES

Our pastes, methods and members will be more specifically described below by way of Examples and Comparative Examples. However, this disclosure is not limited thereto.

Examples 1 to 30, Comparative Examples 1 to 5

A. Evaluation of Particle Size Distribution of Glass Powder

Using a particle size distribution analyzer (MT3300; manufactured by NIKKISO Co., Ltd.), an average particle diameter $d_{50}$ and a maximum particle diameter $d_{max}$ of a glass powder were evaluated. The glass powder was charged in a sample chamber filled with water and subjected to an ultrasonic treatment for 300 seconds, followed by the measurement.

B. Evaluation of Softening Point of Glass Powder

Using DTA (horizontal differential thermobalance TG8120; manufactured by RIGAKU CORPORATION), the temperature of an alumina powder used as a standard sample was raised from room temperature at a rate of 20° C./minute to obtain a DTA curve, and then a softening point Ts was determined by extrapolating a heat absorption completion temperature at an endothermic peak using a tangent method.

C. Preparation of Barrier Rib Paste

A barrier rib paste was prepared by the following procedure.

a. Organic Component

After weighing and mixing an organic solid component composed of the following raw materials in a weight ratio shown in Table 1, 42 parts by weight of an organic solvent (γ-butyrolactone) was added to 35.2 parts by weight of the organic solid component, followed by mixing and stirring to prepare an organic vehicle. Composition of organic solid component:

Photosensitive monomer M-1 (trimethylolpropane triacrylate)

Photosensitive monomer M-2 (tetrapropylene glycol dimethacrylate)

Photosensitive polymer (which is obtained by the addition reaction of carboxyl groups of a copolymer composed of methacrylic acid/methyl methacrylate/styrene (=40/40/30) with 0.4 equivalent of glycidyl methacrylate; weight average molecular weight of 43,000; acid value of 100)

Photo-polymerization initiator (2-benzyl-2-dimethylamino-1-(4-morpholinophenyl)-1-butanone; IC369; manufactured by BASF Corporation)

Sensitizer (2,4-diethylthioxanthone)

Antioxidant (1,6-hexanediol-bis[(3,5-di-t-butyl-4-hydroxyphenyl)propionate])

Ultraviolet ray absorber (Sudan IV; manufactured by TOKYO OHKA KOGYO Co., Ltd.; absorption wavelength; 350 nm and 520 nm)

TABLE 1

| | Components | Examples 1 to 30, Comparative Examples 1 to 5 |
|---|---|---|
| Amount (Parts by weight) | Photosensitive monomer M-1 | 6 |
| | Photosensitive monomer M-2 | 6 |
| | Photosensitive polymer | 18 |
| | Photo-polymerization initiator | 4 |
| | Sensitizer | 1 |
| | Antioxidant | 0.1 |
| | Ultraviolet ray absorber | 0.1 | b. Inorganic Component

A low-softening point glass powder (80% by volume) and 20% by volume of a high-softening point glass powder, each having the following composition were mixed and the obtained mixture was used as an inorganic component.

Low-softening point glass powder: Glass powder with the composition shown in Tables 2 to 4, a softening point, and particle size distribution (symbols in tables respectively have the following meanings; $SiO_2$: silicon oxide, $B_2O_3$: boron oxide, ZnO: zinc oxide, $Li_2O$: lithium oxide, $Na_2O$: sodium oxide, $K_2O$: potassium oxide, MgO: magnesium oxide, CaO: calcium oxide, SrO: strontium oxide, BaO: barium oxide, $TiO_2$: titanium oxide, $ZrO_2$: zirconium hydroxide, $Al_2O_3$: aluminum oxide)

High-softening point glass powder (silicon oxide: 54.5 mol %, boron oxide: 19 mol %, aluminum oxide: 11 mol %, magnesium oxide: 9 mol %, calcium oxide: 5.5 mol %, barium oxide: 0.5 mol %, titanium oxide: 0.5 mol %, softening point Ts: 800° C., $d_{50}$: 2 µm, $d_{max}$: 19 µm)

c. Preparation of Paste

The thus prepared organic vehicle and inorganic component were mixed so that the content of the organic solid component and the content of the inorganic component in the entire solid component excluding the organic solvent become 42% by volume and 58% by volume, respectively, and then the mixture was kneaded by a three-roller kneader to obtain a photosensitive barrier rib paste.

D. Evaluation of Chemical Stability of Glass

Each of glass powders shown in Tables 2 to 4 was remelted to form a block, which was dipped in an aqueous 0.5% sodium carbonate solution at 75° C. for 10 hours, and then a weight reduction ratio before and after dipping of the sample was determined. When the weight reduction ratio is less than 0.7% was rated "A", the weight reduction ratio is 0.7% or more and less than 0.9% was rated "B", when the weight reduction ratio is 0.9% or more and less than 1.2% was rated "C", and when the weight reduction ratio is 1.2% or more was rated "E", respectively. In rating A to rating C, the glass has satisfactory chemical stability, and rating A is most satisfactory. In rating E, the glass is unsuitable because of its poor chemical stability.

E. Production of Substrate for Evaluation

The substrate for evaluation was produced by the following procedure. On a glass substrate PD-200 (42 inch, manufactured by ASAHI GLASS Co., Ltd.), an address electrode pattern was formed by a photolithographic method using a photosensitive silver paste. Then, a 20 µm thickness dielectric layer was formed on the glass substrate with the address electrode formed thereon, by a screen printing method. Then, the process of screen printing and drying of a photosensitive barrier rib paste was repeated several or more times to form a 150 µm thick barrier rib paste dry film on the rear glass substrate with the address electrode pattern and the dielectric layer formed thereon. Drying was performed at 100° C. for 10 minutes in the middle of the process. Subsequently, exposure was performed through an exposure mask. The exposure mask is a chromium mask designed to enable formation of a grid-like barrier rib pattern (vertical pitch of 150 µm, vertical open width of 25 µm, transverse pitch of 450 µm, transverse width of 25 µm) in a plasma display panel. Eight-point exposure was performed in an exposure amount of 250 to 375 mJ/cm² every 25 mJ/cm² by varying an exposure time, using an ultrahigh pressure mercury lamp having an output of 50 mW/cm². Then, development was performed by spraying an aqueous 0.4% by mass solution of sodium carbonate for 150 seconds using a shower, and the unphotocured space portion was removed by washing with water using a shower spray. Thereafter, firing was performed by maintaining at 590° C. for 30 minutes to form a barrier rib, thus producing a substrate for evaluation.

F. Evaluation of Reflectance

In the substrate produced in E, the position where a bottom width of a barrier rib becomes 45 µm was measured by a spectrophotometer (CM-2002; manufactured by Konica Minolta, Inc.) SCE mode, and a reflectance at 530 nm was evaluated. When the reflectance is 50% or more was rated "A", when the reflectance is reflectance 47% or more and less than 50% was rated "B", when the reflectance is 45% or more and less than 47% was rated "C", and when the reflectance is less than 45% was rated "E", respectively. In rating A to rating C, the thus formed barrier rib has satisfactory high reflectance, and rating A is most satisfactory. In rating E, the substrate is unsuitable because of its low reflectance.

G. Viscosity Stability

Using a B type viscometer with a digital computing function (DV-II; manufactured by Brookfield Engineering Laboratories, Inc. USA), the viscosity of the barrier rib paste produced in C was measured at the temperature of 25° C. and the rotational speed of 3 rpm.

The viscosity of the barrier rib paste was measured twice on the first day of the production, and the 7th day after storage at 23° C. for 7 days. A ratio of an increase in viscosity after storage for 7 days was calculated based on the viscosity measured on the first day of the production, which was regarded as an indicator of viscosity stability. When the ratio of an increase in viscosity is less than 3% was rated "A", when the ratio of an increase in viscosity is 3% or more and less than 8% was rated "B", and when the ratio of an increase in viscosity is 8% or more was rated "E". In rating A to rating B, viscosity stability is satisfactory, and rating A is most satisfactory. In rating E, the substrate is unsuitable because of its poor viscosity stability.

H. Evaluation of Yellowing

In the substrate produced in E, the position where a bottom width of a barrier rib becomes 45 pm was measured by a spectrophotometer (CM-2002; manufactured by Konica Minolta, Inc.) SCE mode, and then a b* value was evaluated. When the b* value is less than 4 was rated "A", when the b* value is 4 or more and less than 10 was rated "B", and when the b* value is 10 or more was rated "D". The more the b* value becomes smaller, the better because of low yellowing degree.

I. Minimum Bottom Width of Barrier Rib

A barrier rib of the substrate produced in E was observed and a bottom width of the barrier rib, where no peeling occurred, was measured, and the minimum value was regarded as a minimum bottom width of the barrier rib. Under the production conditions of E, the top width of the barrier rib becomes about 38 µm, and thus the smaller the minimum bottom width of the barrier rib becomes within a range of 38 µm or more, the better since a rectangular barrier rib is formed. When the minimum bottom width of the barrier rib is less than 40 µm was rated "A", and when the minimum bottom width of the barrier rib is 40 or more and less than 50 µm was rated "B", respectively.

The evaluation results of the barrier rib pastes obtained in Examples 1 to 30 and Comparative Examples 1 to 5 are shown in Tables 2 to 4.

TABLE 2

| | | Example 1 | Example 2 | Example 3 | Example 4 | Example 5 | Example 6 |
|---|---|---|---|---|---|---|---|
| Properties of low-softening point glass powder | Composition (mol %) | | | | | | |
| | $SiO_2$ | 34.9 | 35.1 | 35.0 | 35.0 | 35.0 | 34.5 |
| | $B_2O_3$ | 29.0 | 34.0 | 32.5 | 32.5 | 32.5 | 33.0 |
| | ZnO | 5.0 | 0.5 | 3.0 | 3.0 | 3.0 | 4.0 |
| | $Li_2O$ | 9.0 | 9.0 | 6.0 | 14.0 | — | 6.5 |
| | $Na_2O$ | — | — | — | — | — | — |
| | $K_2O$ | 7.0 | 6.0 | 7.0 | — | 14.0 | 6.5 |
| | MgO | 0.2 | 1.0 | 0.5 | 0.5 | 0.5 | 0.3 |
| | CaO | 0.3 | 1.0 | 0.5 | 0.5 | 0.5 | 0.3 |
| | SrO | — | — | 0.5 | — | — | — |
| | BaO | — | — | — | 0.5 | 0.5 | 0.3 |
| | $TiO_2$ | — | — | 1.0 | — | — | — |
| | $ZrO_2$ | — | — | — | — | — | — |
| | $Al_2O_3$ | 14.6 | 13.4 | 14.0 | 14.0 | 14.0 | 14.6 |

TABLE 2-continued

|  |  | | | | | | |
|---|---|---|---|---|---|---|---|
|  | Content of boron oxide (mol %) | 29.0 | 34.0 | 32.5 | 32.5 | 32.5 | 33.0 |
|  | Content of alkali earth metal oxide (mol %) | 0.5 | 2.0 | 1.5 | 1.5 | 1.5 | 0.9 |
|  | Content of zinc oxide (mol %) | 5.0 | 0.5 | 3.0 | 3.0 | 3.0 | 4.0 |
|  | $d_{50}$ (μm) | 2.5 | 2.4 | 2.6 | 2.6 | 2.4 | 2.5 |
|  | $d_{max}$ (μm) | 19.0 | 19.0 | 19.0 | 19.0 | 19.0 | 19.0 |
|  | Softening point Ts (° C.) | 595 | 595 | 603 | 598 | 599 | 596 |
|  | Refractive index | 1.533 | 1.525 | 1.518 | 1.537 | 1.515 | 1.522 |
| Evaluation results of paste | Chemical stability | A | A | A | A | A | A |
|  | Reflectance | A | A | A | A | A | A |
|  | Viscosity stability | A | A | A | A | A | A |
|  | b* value | A | A | A | A | A | A |
|  | Minimum bottom width of barrier rib | B | A | B | B | B | A |

|  |  | | Example 7 | Example 8 | Example 9 | Example 10 | Example 11 | Example 12 |
|---|---|---|---|---|---|---|---|---|
| Properties of low-softening point glass powder | Composition (mol %) | $SiO_2$ | 36.1 | 35.4 | 35.5 | 41.0 | 40.9 | 40.6 |
|  |  | $B_2O_3$ | 31.0 | 32.5 | 32.0 | 30.1 | 29.8 | 26.0 |
|  |  | ZnO | 2.0 | 3.2 | 4.0 | 0.5 | 0.5 | 2.5 |
|  |  | $Li_2O$ | 7.1 | 6.8 | 6.5 | 8.0 | 7.9 | 8.5 |
|  |  | $Na_2O$ | — | — | — | — | — | — |
|  |  | $K_2O$ | 8.0 | 6.8 | 6.5 | 8.6 | 8.0 | 8.0 |
|  |  | MgO | 0.6 | 0.5 | 0.5 | 0.5 | 0.2 | 0.5 |
|  |  | CaO | 0.6 | 0.5 | 0.5 | 0.5 | — | 0.5 |
|  |  | SrO | — | — | — | — | 0.1 | — |
|  |  | BaO | 0.7 | 0.5 | — | 0.5 | 0.2 | — |
|  |  | $TiO_2$ | — | — | — | — | — | — |
|  |  | $ZrO_2$ | — | — | — | — | — | — |
|  |  | $Al_2O_3$ | 13.9 | 13.8 | 14.5 | 9.3 | 9.5 | 13.4 |
|  | Content of boron oxide (mol %) | | 31.0 | 32.5 | 32.0 | 30.1 | 29.8 | 26.0 |
|  | Content of alkali earth metal oxide (mol %) | | 1.9 | 1.5 | 1.0 | 1.5 | 0.5 | 1.0 |
|  | Content of zinc oxide (mol %) | | 2.0 | 3.2 | 4.0 | 0.5 | 0.5 | 2.5 |
|  | $d_{50}$ (μm) | | 2.4 | 2.5 | 2.6 | 2.4 | 2.5 | 2.4 |
|  | $d_{max}$ (μm) | | 19.0 | 19.0 | 19.0 | 19.0 | 19.0 | 19.0 |
|  | Softening point Ts (° C.) | | 593 | 597 | 601 | 594 | 598 | 602 |
|  | Refractive index | | 1.523 | 1.522 | 1.523 | 1.524 | 1.529 | 1.529 |
| Evaluation results of paste | Chemical stability | | A | A | A | A | A | B |
|  | Reflectance | | A | A | A | A | A | A |
|  | Viscosity stability | | A | A | A | A | A | A |
|  | b* value | | A | A | A | A | A | A |
|  | Minimum bottom width of barrier rib | | A | A | A | A | B | B |

TABLE 3

|  |  | | Example 13 | Example 14 | Example 15 | Example 16 | Example 17 | Example 18 |
|---|---|---|---|---|---|---|---|---|
| Properties of low-softening point glass powder | Composition (mol %) | $SiO_2$ | 35.4 | 35.0 | 36.1 | 28.9 | 13.6 | 44.9 |
|  |  | $B_2O_3$ | 35.0 | 31.5 | 32.5 | 32.5 | 24.0 | 24.0 |
|  |  | ZnO | 2.5 | 2.5 | 2.5 | 7.0 | 2.5 | 2.5 |
|  |  | $Li_2O$ | 7.5 | 7.0 | 7.0 | 5.5 | 7.0 | 7.0 |
|  |  | $Na_2O$ | — | — | — | — | — | — |
|  |  | $K_2O$ | 6.5 | 7.0 | 7.0 | 5.5 | 7.0 | 8.5 |
|  |  | MgO | 0.5 | 1.4 | 2.0 | 1.0 | 1.4 | 2.0 |
|  |  | CaO | 0.5 | 1.5 | 2.0 | 1.0 | 1.5 | 2.0 |
|  |  | SrO | — | — | — | — | — | — |
|  |  | BaO | — | — | — | — | — | — |
|  |  | $TiO_2$ | — | — | — | — | — | — |
|  |  | $ZrO_2$ | — | — | — | — | — | — |
|  |  | $Al_2O_3$ | 12.1 | 14.1 | 10.9 | 8.6 | 13.0 | 9.1 |

TABLE 3-continued

|  |  |  |  |  |  |  |  |
|---|---|---|---|---|---|---|---|
|  | Content of boron oxide (mol %) | 35.0 | 31.5 | 32.5 | 32.5 | 24.0 | 24.0 |
|  | Content of alkali earth metal oxide (mol %) | 1.0 | 2.9 | 4.0 | 2.0 | 2.9 | 4.0 |
|  | Content of zinc oxide (mol %) | 2.5 | 2.5 | 2.5 | 7.0 | 2.5 | 2.5 |
|  | $d_{50}$ (μm) | 2.5 | 2.4 | 2.6 | 2.5 | 2.6 | 2.4 |
|  | $d_{max}$ (μm) | 19.0 | 19.0 | 19.0 | 19.0 | 19.0 | 19.0 |
|  | Softening point Ts (° C.) | 595 | 594 | 594 | 602 | 605 | 601 |
|  | Refractive index | 1.520 | 1.525 | 1.529 | 1.529 | 1.521 | 1.533 |
| Evaluation results of paste | Chemical stability | C | A | A | A | B | B |
|  | Reflectance | A | B | C | A | B | C |
|  | Viscosity stability | A | A | A | B | A | A |
|  | b* value | A | A | A | A | A | A |
|  | Minimum bottom width of barrier rib | B | A | B | B | B | B |

|  |  |  | Example 19 | Example 20 | Example 21 | Example 22 | Example 23 | Example 24 |
|---|---|---|---|---|---|---|---|---|
| Properties of low-softening point glass powder | Composition (mol %) | $SiO_2$ | 38.0 | 35.6 | 35.1 | 35.0 | 30.1 | 35.1 |
|  |  | $B_2O_3$ | 24.0 | 31.5 | 31.5 | 37.0 | 37.0 | 37.0 |
|  |  | ZnO | 10.0 | 10.0 | 10.0 | 2.5 | 2.5 | 10.0 |
|  |  | $Li_2O$ | 8.5 | 5.0 | 6.0 | 5.0 | 7.0 | 5.0 |
|  |  | $Na_2O$ | — | — | — | — | — | — |
|  |  | $K_2O$ | 8.5 | 5.0 | 6.0 | 5.0 | 7.0 | 4.0 |
|  |  | MgO | 0.5 | 1.4 | 2.0 | 1.4 | 2.0 | 0.5 |
|  |  | CaO | 0.5 | 1.5 | 2.0 | 1.5 | 2.0 | 0.5 |
|  |  | SrO | — | — | — | — | — | — |
|  |  | BaO | — | — | — | — | — | — |
|  |  | $TiO_2$ | — | — | — | — | — | — |
|  |  | $ZrO_2$ | — | — | — | — | — | — |
|  |  | $Al_2O_3$ | 10.0 | 10.0 | 7.4 | 12.6 | 12.4 | 7.9 |
|  | Content of boron oxide (mol %) |  | 24.0 | 31.5 | 31.5 | 37.0 | 37.0 | 37.0 |
|  | Content of alkali earth metal oxide (mol %) |  | 1.0 | 2.9 | 4.0 | 2.9 | 4.0 | 1.0 |
|  | Content of zinc oxide (mol %) |  | 10.0 | 10.0 | 10.0 | 2.5 | 2.5 | 10.0 |
|  | $d_{50}$ (μm) |  | 2.5 | 2.4 | 2.5 | 2.6 | 2.4 | 2.5 |
|  | $d_{max}$ (μm) |  | 19.0 | 19.0 | 19.0 | 19.0 | 19.0 | 19.0 |
|  | Softening point Ts (° C.) |  | 597 | 599 | 597 | 600 | 593 | 598 |
|  | Refractive index |  | 1.548 | 1.535 | 1.544 | 1.513 | 1.529 | 1.530 |
| Evaluation results of paste | Chemical stability |  | B | A | A | C | C | C |
|  | Reflectance |  | A | B | C | B | C | A |
|  | Viscosity stability |  | B | B | B | A | A | B |
|  | b* value |  | A | A | A | A | A | A |
|  | Minimum bottom width of barrier rib |  | B | B | B | B | B | B |

TABLE 4

|  |  |  | Example 25 | Example 26 | Example 27 | Example 28 | Example 29 | Example 30 |
|---|---|---|---|---|---|---|---|---|
| Properties of low-softening point glass powder | Composition (mol %) | $SiO_2$ | 40.0 | 36.9 | 38.0 | 34.9 | 38.0 | 39.1 |
|  |  | $B_2O_3$ | 24.0 | 24.0 | 37.0 | 37.0 | 31.5 | 29.5 |
|  |  | ZnO | 10.0 | 10.0 | 10.0 | 10.0 | 2.5 | 1.0 |
|  |  | $Li_2O$ | 7.0 | 6.0 | 5.0 | 6.0 | 4.5 | 4.0 |
|  |  | $Na_2O$ | — | — | — | — | 3.5 | 5.0 |
|  |  | $K_2O$ | 7.0 | 9.0 | 2.1 | 6.0 | 7.0 | 7.0 |
|  |  | MgO | 1.4 | 2.0 | 1.4 | 2.0 | 0.5 | 0.2 |
|  |  | CaO | 1.5 | 2.0 | 1.5 | 2.0 | 0.5 | 0.3 |
|  |  | SrO | — | — | — | — | — | — |
|  |  | BaO | — | — | — | — | — | — |
|  |  | $TiO_2$ | — | — | — | — | — | — |
|  |  | $ZrO_2$ | — | — | — | — | — | — |
|  |  | $Al_2O_3$ | 9.1 | 10.1 | 5.0 | 2.1 | 12.0 | 13.9 |
|  | Content of boron oxide (mol %) |  | 24.0 | 24.0 | 37.0 | 37.0 | 31.5 | 29.5 |
|  | Content of alkali earth metal oxide (mol %) |  | 2.9 | 4.0 | 2.9 | 4.0 | 1.0 | 0.5 |

TABLE 4-continued

|  |  |  |  |  |  |  |  |
|---|---|---|---|---|---|---|---|
|  | Content of zinc oxide (mol %) | 10.0 | 10.0 | 10.0 | 10.0 | 2.5 | 1.0 |
|  | $d_{50}$ (μm) | 2.4 | 2.5 | 2.4 | 2.6 | 2.5 | 2.6 |
|  | $d_{max}$ (μm) | 19.0 | 19.0 | 19.0 | 19.0 | 19.0 | 19.0 |
|  | Softening point Ts (° C.) | 601 | 596 | 600 | 595 | 599 | 600 |
|  | Refractive index | 1.543 | 1.554 | 1.530 | 1.547 | 1.521 | 1.520 |
| Evaluation results of paste | Chemical stability | B | B | C | C | A | A |
|  | Reflectance | B | C | B | C | A | A |
|  | Viscosity stability | B | B | B | B | A | A |
|  | b* value | A | A | A | A | B | D |
|  | Minimum bottom width of barrier rib | B | B | B | B | B | B |

|  |  |  | Comparative Example 1 | Comparative Example 2 | Comparative Example 3 | Comparative Example 4 | Comparative Example 5 |
|---|---|---|---|---|---|---|---|
| Properties of low-softening point glass powder | Composition (mol %) | $SiO_2$ | 44.9 | 35.1 | 36.1 | 34.9 | 28.0 |
|  |  | $B_2O_3$ | 23.0 | 38.0 | 31.5 | 31.5 | 30.5 |
|  |  | ZnO | 0.5 | 3.0 | 2.5 | 11.0 | 3.1 |
|  |  | $Li_2O$ | 7.0 | 6.0 | 7.0 | 6.0 | 15.2 |
|  |  | $Na_2O$ | — | — | — | — | — |
|  |  | $K_2O$ | 7.0 | 6.0 | 7.0 | 6.0 | — |
|  |  | MgO | 0.2 | 1.0 | 2.5 | 0.5 | 3.7 |
|  |  | CaO | 0.2 | 1.0 | 2.5 | 0.5 | 3.3 |
|  |  | SrO | — | — | — | — | — |
|  |  | BaO | 0.1 | — | — | — | 1.3 |
|  |  | $TiO_2$ | — | — | — | — | — |
|  |  | $ZrO_2$ | — | — | — | — | — |
|  |  | $Al_2O_3$ | 17.1 | 9.9 | 10.9 | 9.6 | 14.9 |
|  | Content of boron oxide (mol %) |  | 23.0 | 38.0 | 31.5 | 31.5 | 30.5 |
|  | Content of alkali earth metal oxide (mol %) |  | 0.5 | 2.0 | 5.0 | 1.0 | 8.3 |
|  | Content of zinc oxide (mol %) |  | 0.5 | 3.0 | 2.5 | 11.0 | 3.1 |
|  | $d_{50}$ (μm) |  | 2.4 | 2.5 | 2.4 | 2.5 | 2.4 |
|  | $d_{max}$ (μm) |  | 19.0 | 19.0 | 19.0 | 19.0 | 19.0 |
|  | Softening point Ts (° C.) |  | 611 | 597 | 597 | 597 | 585 |
|  | Refractive index |  | 1.512 | 1.520 | 1.530 | 1.540 | 1.560 |
| Evaluation results of paste | Chemical stability |  | E | E | A | A | A |
|  | Reflectance |  | A | A | E | A | E |
|  | Viscosity stability |  | A | A | A | E | A |
|  | b* value |  | A | A | A | A | A |
|  | Minimum bottom width of barrier rib |  | B | B | B | B | B |

In Examples 1 to 28, silicon oxide, aluminum oxide, and an alkali metal oxide are contained, and also the content of boron oxide is within a range of 24 to 37 mol %, the content of the alkali earth metal oxide is 4 mol % or less, and the content of zinc oxide is 10 mol % or less, and thus the formed barrier rib exhibited satisfactory high reflectance in all cases.

In Examples 29 and 30 containing sodium oxide, the b* value slightly increased. However, silicon oxide, aluminum oxide, and an alkali metal oxide are contained, and also the content of boron oxide is within a range of 24 to 37 mol %, the content of the alkali earth metal oxide is 4 mol % or less, and the content of zinc oxide is 10 mol % or less, and thus the formed barrier rib exhibited satisfactory high reflectance.

In Comparative Examples 1 and 2, the content of boron oxide is not within a range of 24 to 37 mol %, and thus they were rated "failure" because of poor chemical stability.

In Comparative Examples 3 and 5, the content of the alkali earth metal oxide is more than 4 mol %, and thus they were rated "failure" because of poor reflectance.

In Comparative Example 4, the content of zinc oxide is more than 10 mol %, and thus it was rated "failure" because of poor viscosity stability.

INDUSTRIAL APPLICABILITY

We effectively employ a barrier rib paste to form a barrier rib which contains less carbon residue and also has high reflectance.

The invention claimed is:

1. A member including a barrier rib, comprising a low-softening point glass as a main component, wherein
the low-softening point glass contains silicon oxide, aluminum oxide, an alkali metal oxide, and 24 to 37 mol % of a boron oxide, and content of an alkaline earth metal oxide is less than 2 mol % and content of zinc oxide is 5 mol % or less.

2. A plasma display panel comprising the member according to claim 1.

3. A radiographic apparatus comprising the member according to claim 1.

4. The member according to claim 1, wherein the content of boron oxide in the low-softening point glass powder is 24 to 34 mol %, and the content of sodium oxide in the low-softening point glass powder is 3.5 mol % or less.

5. The member according to claim 1, wherein the alkaline earth metal oxide content is 1.9 mol % or less.

* * * * *